United States Patent
Nakashima et al.

(10) Patent No.: US 10,283,270 B2
(45) Date of Patent: May 7, 2019

(54) ELECTRONIC COMPONENT AND COMPONENT-EMBEDDED SUBSTRATE

(71) Applicant: FUJITSU LIMITED, Kawasaki-shi, Kanagawa (JP)

(72) Inventors: Tomokazu Nakashima, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/182,066

(22) Filed: Jun. 14, 2016

(65) Prior Publication Data

US 2017/0019999 A1 Jan. 19, 2017

(30) Foreign Application Priority Data

Jul. 15, 2015 (JP) ................. 2015-141196

(51) Int. Cl.
| | |
|---|---|
| *H05K 1/18* | (2006.01) |
| *H01G 4/248* | (2006.01) |
| *H01G 4/30* | (2006.01) |
| *H01G 4/005* | (2006.01) |
| *H01G 4/12* | (2006.01) |
| *H05K 3/46* | (2006.01) |

(52) U.S. Cl.
CPC ............ *H01G 4/248* (2013.01); *H01G 4/005* (2013.01); *H01G 4/12* (2013.01); *H01G 4/30* (2013.01); *H05K 1/185* (2013.01); *H05K 3/4697* (2013.01); *H05K 2201/10015* (2013.01)

(58) Field of Classification Search
CPC ..................................... H05K 1/184
USPC ......................................... 174/260
See application file for complete search history.

(56) References Cited

U.S. PATENT DOCUMENTS

| | | | | |
|---|---|---|---|---|
| 8,325,489 | B2* | 12/2012 | Togashi | H05K 1/0231 174/261 |
| 9,105,405 | B2* | 8/2015 | Masuda | H01G 4/30 |
| 9,307,643 | B2* | 4/2016 | Nakagome | H05K 3/4084 |
| 2008/0122120 | A1 | 5/2008 | Itoh et al. | |
| 2012/0112237 | A1* | 5/2012 | Zheng | H01L 25/167 257/99 |
| 2014/0174800 | A1 | 6/2014 | Chang et al. | |
| 2016/0088725 | A1* | 3/2016 | Park | H05K 1/0271 174/260 |
| 2016/0351543 | A1* | 12/2016 | Ryu | H01L 25/04 |

FOREIGN PATENT DOCUMENTS

| | | |
|---|---|---|
| JP | 1-123328 | 8/1989 |
| JP | 4-38808 | 2/1992 |
| JP | 2000-306764 | 11/2000 |

(Continued)

OTHER PUBLICATIONS

Notification of Reasons for Refusal Japanese Patent Application No. 2015-141196 dated Jan. 15, 2019.

*Primary Examiner* — Stanley Tso
(74) *Attorney, Agent, or Firm* — Staas & Halsey LLP

(57) ABSTRACT

An electronic component includes: a component body into which elements are built; and a metal plate electrode that is joined to the component body by conductive paste so as to be electrically coupled to the elements, wherein the metal plate electrode exceeds in size a surface of the component body onto which the conductive paste is deposited.

2 Claims, 15 Drawing Sheets

(56) References Cited

FOREIGN PATENT DOCUMENTS

| | | |
|---|---|---|
| JP | 2001-185832 A | 7/2001 |
| JP | 2003-168871 A | 6/2003 |
| JP | 2008-140792 A | 6/2008 |
| JP | 2014-123707 | 7/2014 |

* cited by examiner

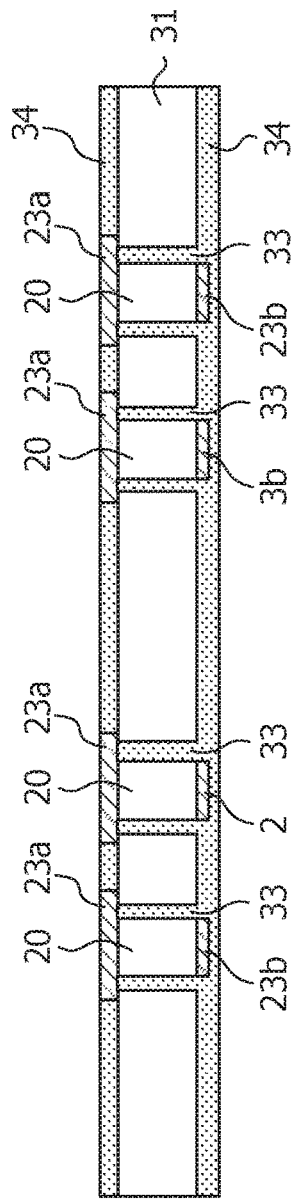
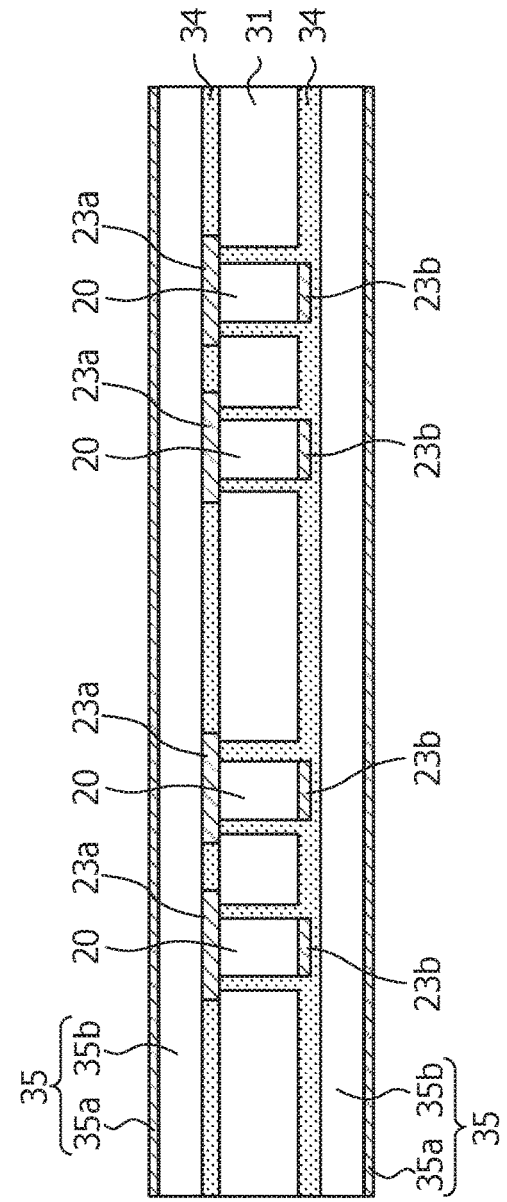
FIG. 6A
FIG. 6B

ELECTRONIC COMPONENT AND COMPONENT-EMBEDDED SUBSTRATE

CROSS-REFERENCE TO RELATED APPLICATION

This application is based upon and claims the benefit of priority of the prior Japanese Patent Application No. 2015-141196, filed on Jul. 15, 2015, the entire contents of which are incorporated herein by reference.

FIELD

The embodiments discussed herein are related to an electronic component and a component-embedded substrate.

BACKGROUND

With miniaturization of and performance improvement in electronic equipment in recent years, use of interconnection substrates (which will be referred to as "component-embedded substrates" hereinafter) in which electronic components such as capacitors and resistors are embedded has increased. A component-embedded substrate is manufactured by insertion of electronic components into holes made in a core substrate, fixation of the electronic components with resin, and sequential formation of insulating layers, vias, and interconnections, for instance. Laser is used for the formation of the vias.

As the electronic components embedded in the interconnection substrate, electronic components that are the same as chip components for surface mounting are often used.

Conventionally, an electronic component for surface mounting in which leads are connected through metal plates to a chip component has been proposed. Besides, there has been proposed an electronic component to be embedded in a substrate, in which the electronic component includes electrodes each having a structure with lamination of a foundation layer formed by baking of metallic paste containing glass and a surface layer formed by baking of metallic paste not containing glass.

Positional deviations may occur when the vias to be connected to the electronic components embedded in the substrate are formed. In case where the positional deviations of the vias occur, increases in resistances between the electronic components and the vias may cause malfunction or the like.

The followings are reference documents.
[Document 1] Japanese Laid-open Patent Publication No. 2000-306764 and
[Document 2] Japanese Laid-open Patent Publication No. 2014-123707.

SUMMARY

According to an aspect of the invention, an electronic component includes: a component body into which elements are built; and a metal plate electrode that is joined to the component body by conductive paste so as to be electrically coupled to the elements, wherein the metal plate electrode exceeds in size a surface of the component body onto which the conductive paste is deposited.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B are schematic sectional views (part 2) illustrating the method of manufacturing the component-embedded substrate in which the electronic component is used;

DESCRIPTION OF EMBODIMENT

Hereinafter, description on preliminary matters for facilitating understanding of an embodiment will be provided before description on the embodiment.

Figure 1:
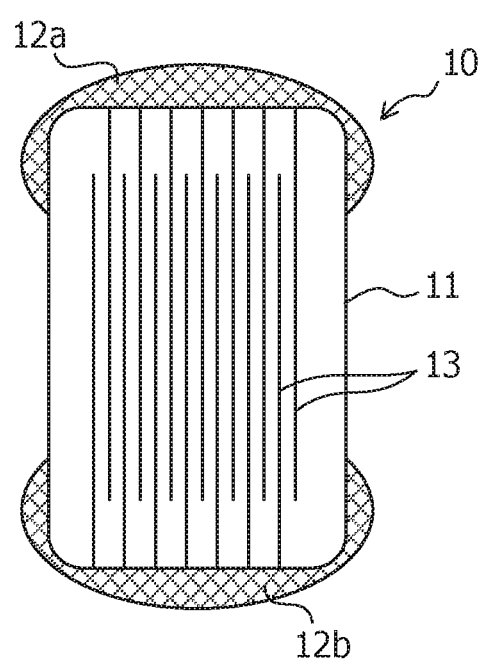
FIG. 1 is a schematic sectional view illustrating an example of an electronic component that is to be embedded in a substrate for use.

FIG. 1 is a schematic sectional view illustrating an example of an electronic component that is to be embedded in a substrate for use. Herein, the description will be given with use of a chip ceramic capacitor as the example of the electronic component.

The electronic component 10 illustrated in FIG. 1 includes a component body 11 that has a structure in which a plurality of ceramic (dielectric) sheets and a plurality of internal electrodes 13 are laminated and a pair of external electrodes 12a, 12b that are electrically connected to the internal electrodes 13.

The external electrodes 12a, 12b are formed by deposition of conductive paste onto upper and lower surfaces of the component body 11 by dipping and subsequent heat treatment (baking treatment) at a specified temperature. Accordingly, the external electrodes 12a, 12b have a rounded shape.

Laser is used for formation of vias to be connected to the electronic component 10 embedded in the substrate. Positional deviations, however, may occur between the vias and the external electrodes 12a, 12b because a certain amount of positional deviation occurs when the electronic component 10 is placed in a hole in the substrate and because the electronic component 10 is covered with resin so as to be invisible during irradiation with the laser.

For the embodiment below, description will be given on an electronic component in which reliable connection between vias and electrodes may be provided even if the positional deviations occur in formation of the vias and on a component-embedded substrate in which the electronic component is used.

Embodiment

Figure 2:
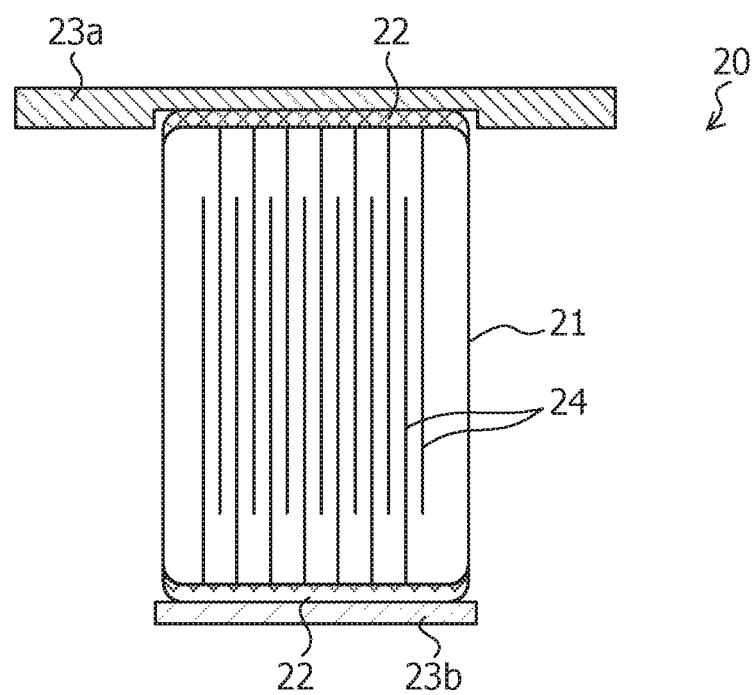
FIG. 2 is a schematic diagram of an electronic component according to an embodiment.
Figure 3:
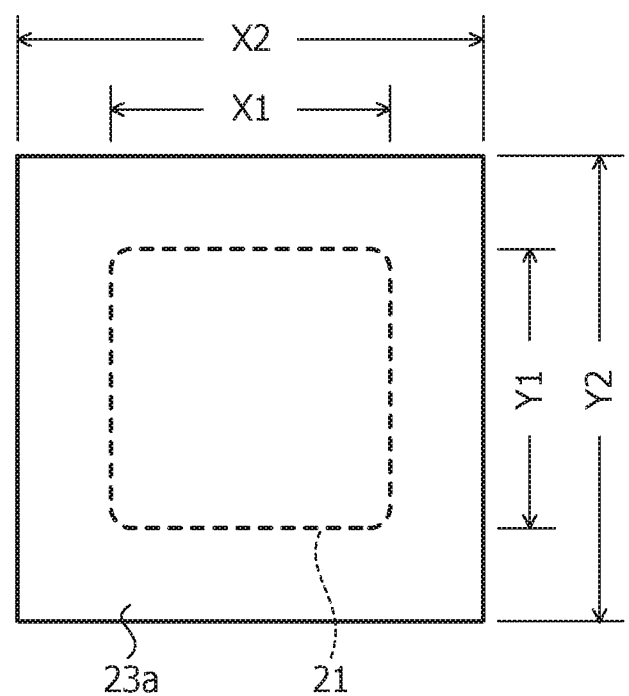
FIG. 3 is a top plan view of the electronic component according to the embodiment.

FIG. 2 is a schematic diagram of the electronic component according to the embodiment and FIG. 3 is a top plan view of the electronic component according to the embodiment. As the embodiment, an example in which the electronic component is a chip ceramic capacitor will be described.

As illustrated in FIG. 2, the electronic component 20 according to the embodiment includes a component body 21, baked electrodes 22, and metal plate electrodes 23a, 23b. The baked electrodes 22 are made of conductive paste having undergone baking treatment.

The component body 21 has a structure in which a plurality of ceramic (dielectric) sheets and a plurality of internal electrodes 24 are laminated and a specified capacity is provided by the internal electrodes 24 and the ceramic. The internal electrodes 24 are an example of elements built in the component body 21.

The metal plate electrode 23a is joined onto an upper part of the component body 21 through the baked electrode 22. The metal plate electrode 23b is joined onto a lower part of the component body 21 through the baked electrode 22.

For convenience of description, hereinafter, surfaces of the component body 21 onto which the baked electrodes 22 (conductive paste) are deposited will be referred to as electrode joint surfaces. In the example illustrated in FIG. 2, top and bottom surfaces of the component body 21 are the electrode joint surfaces.

The metal plate electrode 23a exceeds the upper electrode joint surface of the component body 21 in size (area) and edge parts of the metal plate electrode 23a protrude laterally from the component body 21. As illustrated in FIG. 3, length and width (X1, Y1) of the component body 21 as seen looking from above are 200 μm, for instance, and length and width (X2, Y2) of the metal plate electrode 23a as seen looking from above are between 300 μm and 500 μm, for instance.

By contrast, the metal plate electrode 23b has generally the same length and width as the lower electrode joint surface of the component body 21 has.

In the electronic component 20 illustrated in FIG. 2, a recessed part is formed at center on a lower surface of the metal plate electrode 23a and a part of the metal plate electrode 23a that fits the component body 21 is thinner than the edge parts of the metal plate electrode 23a. This configuration is intended for facilitating positioning between the electronic component 20 and the metal plate electrode 23a. Provision of the recessed part on the metal plate electrode 23a has advantages in that the provision allows a height of the component body 21 to be increased by a depth of the recessed part and thereby makes it easier to ensure desired characteristics (capacity value, withstand voltage, or the like, for instance). The recessed part of the metal plate electrode 23a is not indispensable and may be formed as appropriate.

Figure 4A:
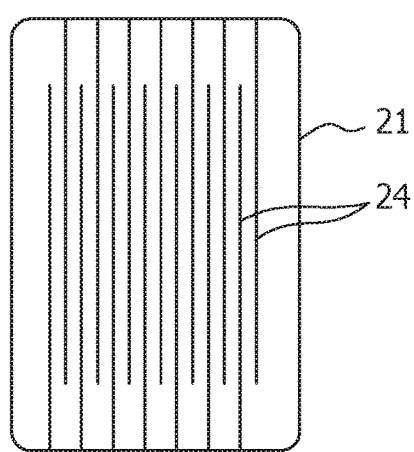
FIGS. 4A to 4C are diagrams illustrating steps of manufacturing the electronic component.
Figure 4B:
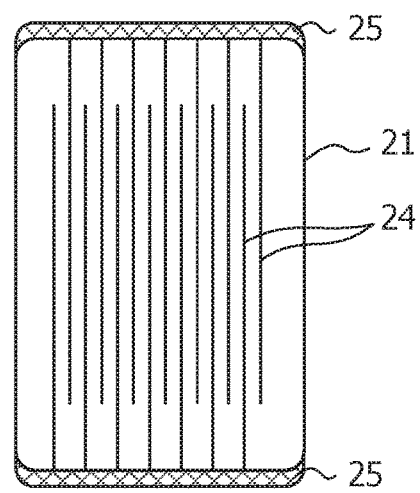
Figure 4C:
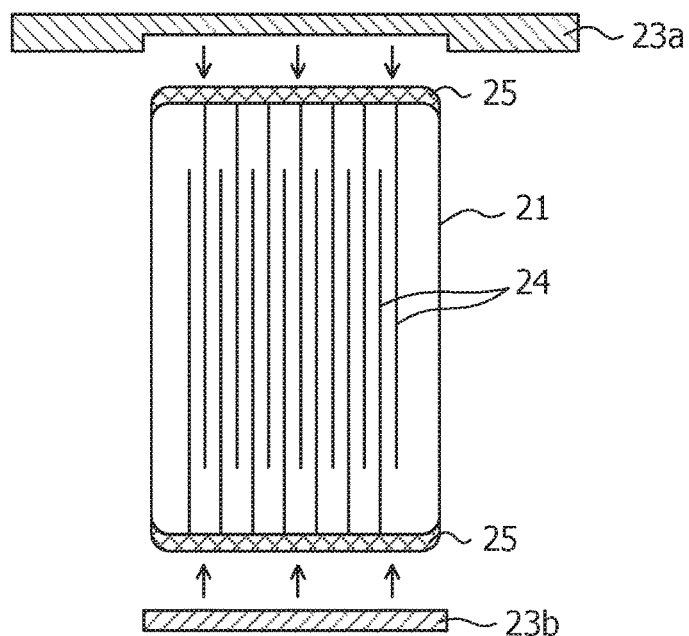

FIGS. 4A to 4C are diagrams illustrating steps of manufacturing the electronic component 20 described above.

Initially, conductive coating material that is to form the internal electrodes 24 is applied with specified patterns onto surfaces of the ceramic sheets (green sheets). After that, the plurality of ceramic sheets are laminated, integrated by application of a pressure, cut into pieces with a specified size, and thereafter fired by heat treatment at a temperature between 1000° C. and 1300° C., for instance. Thus the component body 21 illustrated in FIG. 4A is finished.

As illustrated in FIG. 4B, the conductive paste 25 is subsequently deposited on the top and bottom surfaces of the component body 21 by dipping. As the conductive paste 25, metal paste of copper, silver, or the like, resin (conductive resin) containing filler metal having conductivity, or the like may be used, for instance.

As illustrated in FIG. 4C, the metal plate electrodes 23a, 23b are affixed onto the conductive paste 25 when the conductive paste 25 is in a semi-hardened state. Copper plates, kovar plates, or the like may be used as the metal plate electrodes 23a, 23b. Thicknesses of the metal plate electrodes 23a, 23b have only to be such as to ensure protection of the component body 21 during irradiation with laser and are between 10 μm and 15 μm, for instance.

After that, the conductive paste 25 is baked by heat treatment at a temperature of 800° C., for instance, so as to be made into the baked electrodes 22. Thus the metal plate electrodes 23a, 23b are tightly connected to the component body 21 through the baked electrodes 22 and the electronic component 20 illustrated in FIG. 2 is thereby finished.

FIGS. 5A to 8 are schematic sectional views illustrating a method of manufacturing a component-embedded substrate in which the electronic component 20 described above is used, in accordance with a sequence of steps.

Figure 5A:
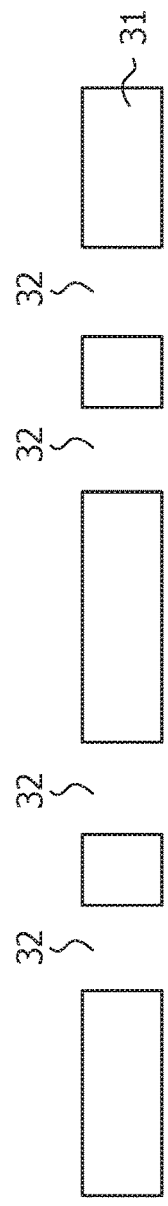
FIGS. 5A and 5B are schematic sectional views (part 1) illustrating a method of manufacturing a component-embedded substrate in which the electronic component is used.

As illustrated in FIG. 5A, initially, a core substrate 31 is prepared and holes 32 piercing through the core substrate 31 are formed by a drill at specified positions on the core substrate 31. A diameter of the holes 32 is such as to permit the component body 21 and the metal plate electrode 23b of the electronic component 20 to enter the holes 32.

Figure 5B:
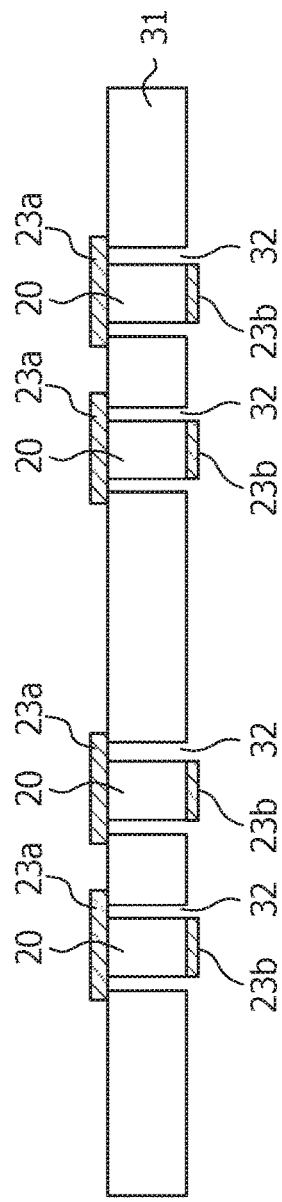

The electronic components 20 are thereafter inserted into the holes 32. In the embodiment, as illustrated in FIG. 5B, the component bodies 21 and the metal plate electrodes 23b are placed in the holes 32 and the metal plate electrodes 23a are placed on the holes 32.

As illustrated in FIG. 6A, subsequently, the holes 32 are filled with resin 33 so that the electronic components 20 are fixed and prepreg 34 is affixed onto upper and lower surfaces of the core substrate 31.

As illustrated in FIG. 6B, subsequently, resin coated copper foil (RCC) 35 including copper foil 35a and insulating films 35b is affixed onto the upper and lower surfaces of the core substrate 31.

Figure 7A:
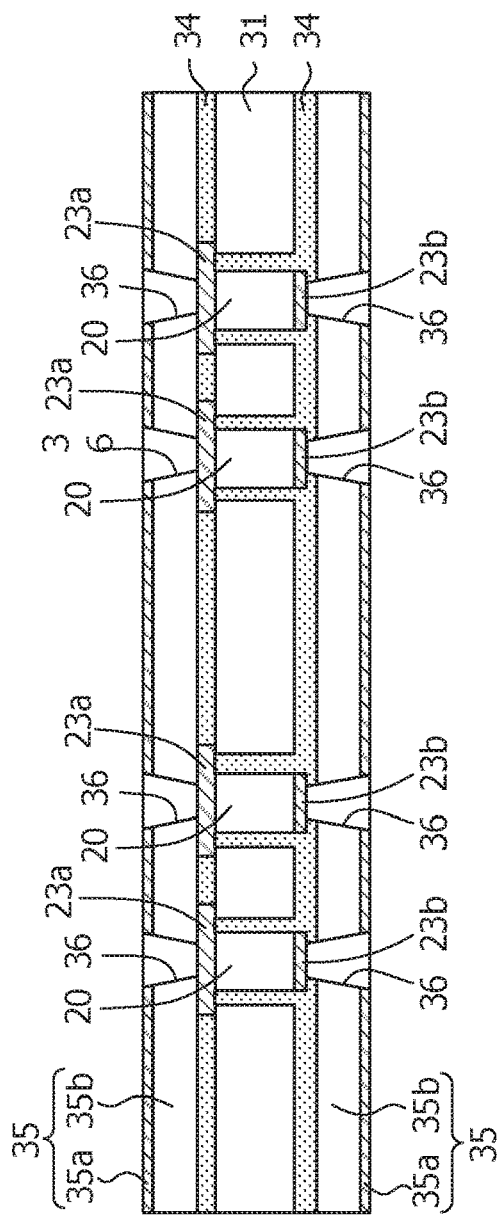
FIGS. 7A and 7B are schematic sectional views (part 3) illustrating the method of manufacturing the component-embedded substrate in which the electronic component is used.

After that, as illustrated in FIG. 7A, laser is used to form via holes 36 at specified positions on the RCC 35 and to expose the metal plate electrodes 23a, 23b.

Figure 7B:
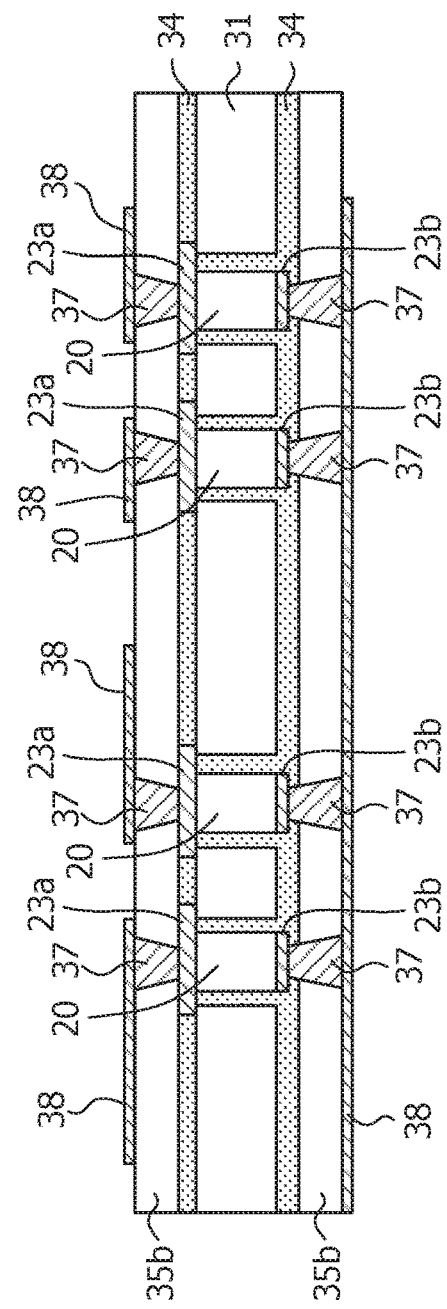

Subsequently, desmear is carried out in the via holes 36 and copper is thereafter deposited in the via holes 36 by plating so as to form vias 37 as illustrated in FIG. 7B. After that, the copper foil is subjected to patterning by photolithography so that interconnections 38 are formed.

Figure 8:
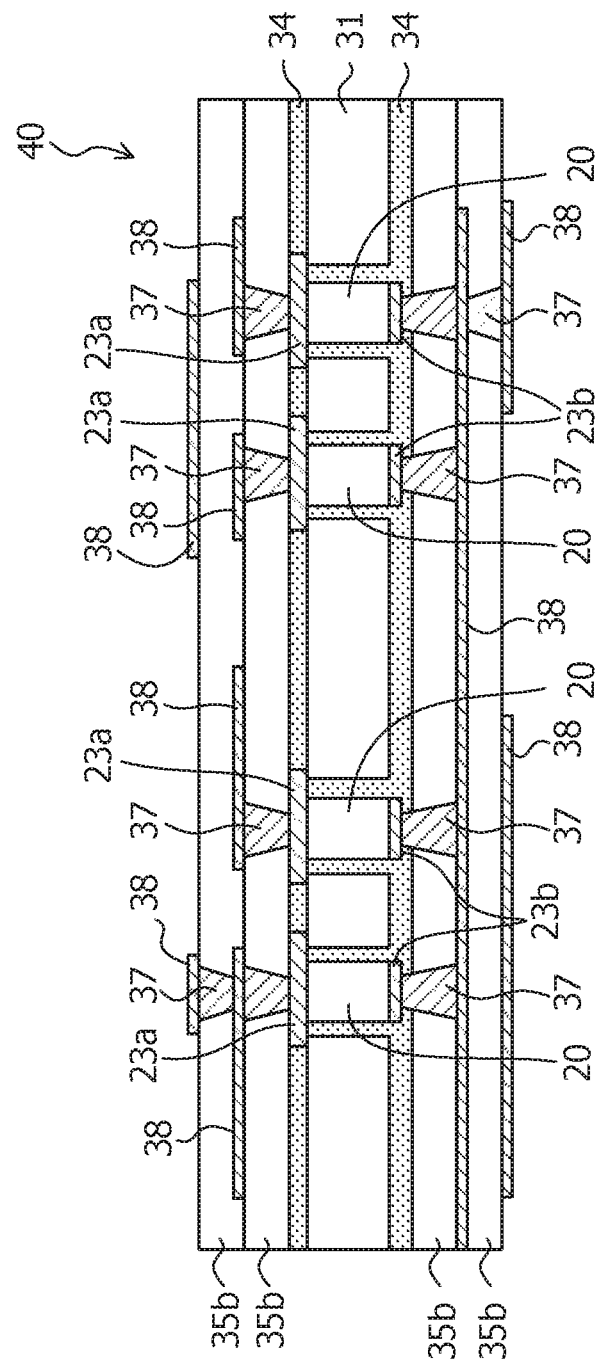
FIG. 8 is a schematic sectional view (part 4) illustrating the method of manufacturing the component-embedded substrate in which the electronic component is used.

Subsequently, steps of affixing the RCC, forming the via holes, and forming the vias and the interconnections are iterated and a component-embedded substrate 40 having such a multilayer interconnection structure as illustrated in FIG. 8 is finished.

Figure 9:
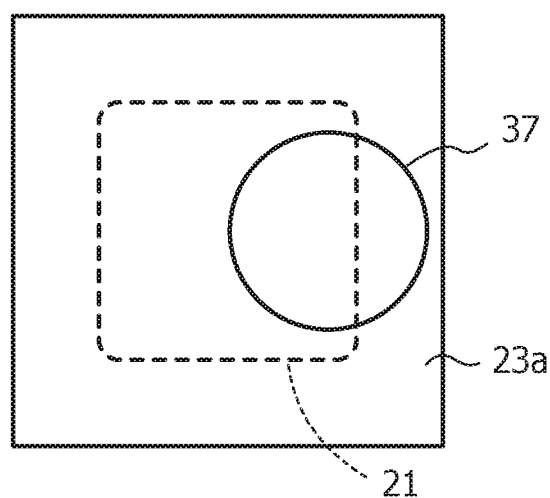
FIG. 9 is a top plan view illustrating effects of the electronic component according to the embodiment.

In the electronic component 20 according to the embodiment, the metal plate electrode 23a is made to exceed the electrode joint surface of the component body 21 in size. Therefore, reliable connection between the metal plate electrode 23a and the via 37 may be provided even if the via 37 is formed at a position deviated from a center part of the component body 21 as illustrated in a top plan view of FIG. 9, for instance.

In the electronic component 20 according to the embodiment, as illustrated in FIG. 2, the electrode joint surfaces of the component body 21 are covered with the metal plate electrodes 23a, 23b. When the electronic component 20 is irradiated with the laser during formation of the via holes (see FIG. 7A), therefore, the component body 21 is inhibited from being damaged and breakage of the electronic component 20 is thus avoided.

In the electronic component that is used in the conventional component-embedded substrate, as illustrated in FIG. 1, the external electrodes 12a, 12b are formed of the conductive paste. In case where edge parts (parts having small film thicknesses) of the external electrodes 12a, 12b are irradiated with the laser because of the positional deviations, the component body 11 may be damaged so that breakage of the electronic component 10 may be caused.

Figure 10:
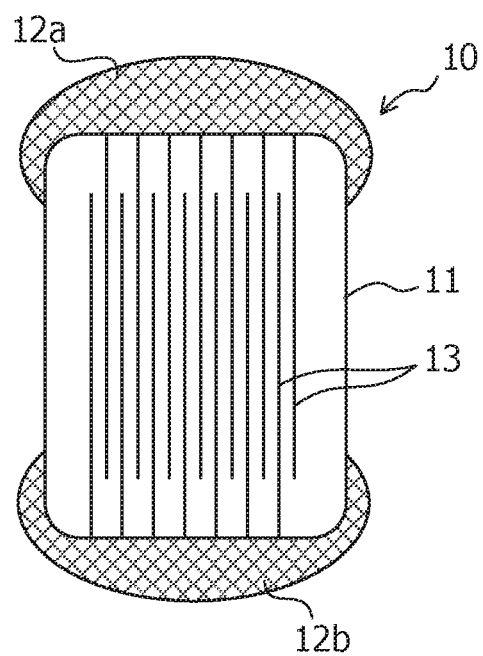
FIG. 10 is a schematic sectional view illustrating an example of an electronic component in which film thicknesses of external electrodes are increased for avoidance of breakage that may be caused by laser.

In order to avoid such a trouble, it is conceivable to increase the film thicknesses of the external electrodes 12a, 12b as illustrated in FIG. 10. A height of the component body 11 has to be decreased in order to increase the film thicknesses of the external electrodes 12a, 12b because a height of the electronic component 10 is restricted by a thickness of a core substrate. Decrease in the height of the component body 11, however, may make it impossible to ensure desired characteristics (capacity value, withstand voltage, or the like, for instance).

The electronic component 20 according to the embodiment is connected to the interconnections through the metal plate electrodes 23a, 23b and therefore allows the height of the component body 21 to be made greater than the electronic component 10 illustrated in FIG. 10. Accordingly, the electronic component 20 has an advantage in that relaxed restriction on the size of the component body 21 facilitates ensuring the desired characteristics (capacity value, withstand voltage, or the like, for instance).

Though the example in which the electronic components to be embedded in the substrate are capacitors has been described as the embodiment, the disclosed technique may be applied to resistors, ferrite beads, or other electronic components.

(Modification 1)

Figure 11A:
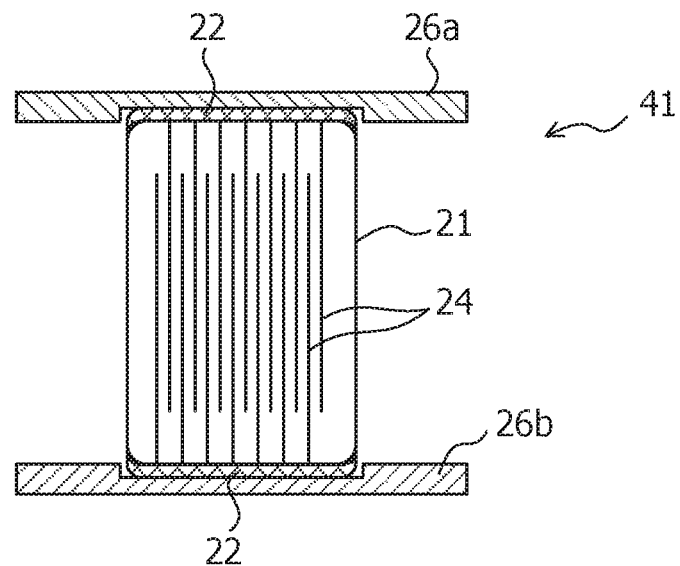
FIG. 11A is a schematic diagram illustrating an electronic component according to modification 1.
Figure 11B:
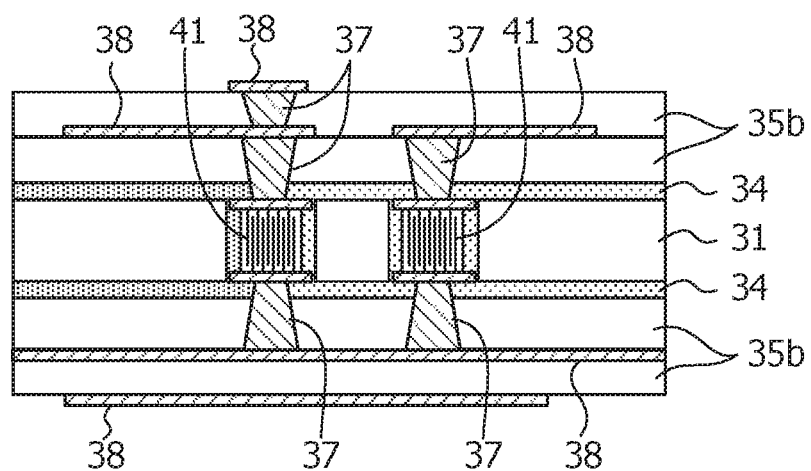
FIG. 11B is a schematic sectional view illustrating a component-embedded substrate in which the electronic component according to modification 1 is used.

FIG. 11A is a schematic diagram illustrating an electronic component according to modification 1 of the embodiment and FIG. 11B is a schematic sectional view illustrating a component-embedded substrate in which the electronic component according to modification 1 is used. Elements in FIGS. 11A and 11B that are the same as the elements in FIGS. 2 and 8 are provided with reference characters that are the same as the reference characters in FIGS. 2 and 8.

In the electronic component 41 illustrated in FIG. 11A, the top and bottom surfaces of the component body 21 are the electrode joint surfaces and metal plate electrodes 26a, 26b are connected to the electrode joint surfaces through the baked electrodes 22. Sizes of the metal plate electrodes 26a, 26b are set so as to exceed sizes of the electrode joint surfaces of the component body 21.

As illustrated in FIG. 11B, the electronic components 41 are placed in holes formed in the core substrate 31 and are connected to the interconnections 38 through the vias 37 on a top side and a bottom side of the component body 21.

(Modification 2)

Figure 12A:
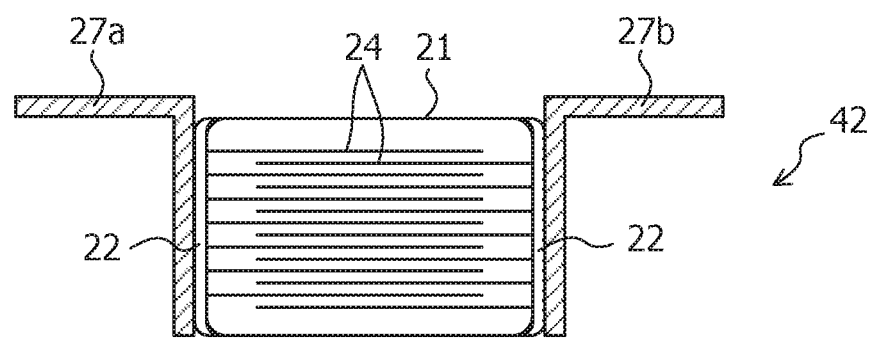
FIG. 12A is a schematic diagram illustrating an electronic component according to modification 2.
Figure 12B:
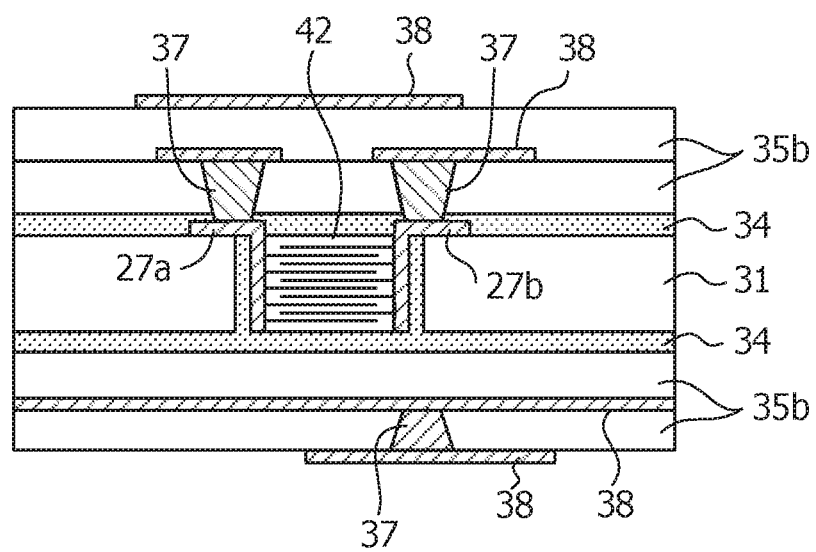
FIG. 12B is a schematic sectional view illustrating a component-embedded substrate in which the electronic component according to modification 2 is used.

FIG. 12A is a schematic diagram illustrating an electronic component according to modification 2 of the embodiment and FIG. 12B is a schematic sectional view illustrating a component-embedded substrate in which the electronic component according to modification 2 is used. Elements in FIGS. 12A and 12B that are the same as the elements in FIGS. 2 and 8 are provided with reference characters that are the same as the reference characters in FIGS. 2 and 8.

In the electronic component 42 illustrated in FIG. 12A, side surfaces of the component body 21 are the electrode joint surfaces and metal plate electrodes 27a, 27b in shape of a letter L are connected to the electrode joint surfaces through the baked electrodes 22.

Sizes of the metal plate electrodes 27a, 27b are set so as to exceed sizes of the electrode joint surfaces of the component body 21 and parts of the metal plate electrodes 27a, 27b that further extend from bent parts thereof extend sideward from the component body 21.

As illustrated in FIG. 12B, the electronic component 42 is placed in a hole provided in the core substrate 31 and the metal plate electrodes 27a, 27b are connected to the vias 37 above the core substrate 31.

(Modification 3)

Figure 13A:
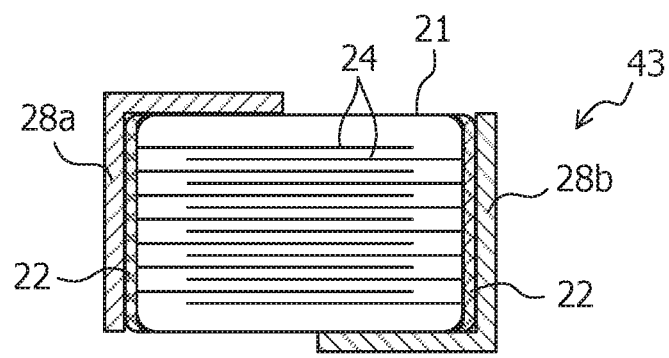
FIG. 13A is a schematic diagram illustrating an electronic component according to modification 3.
Figure 13B:
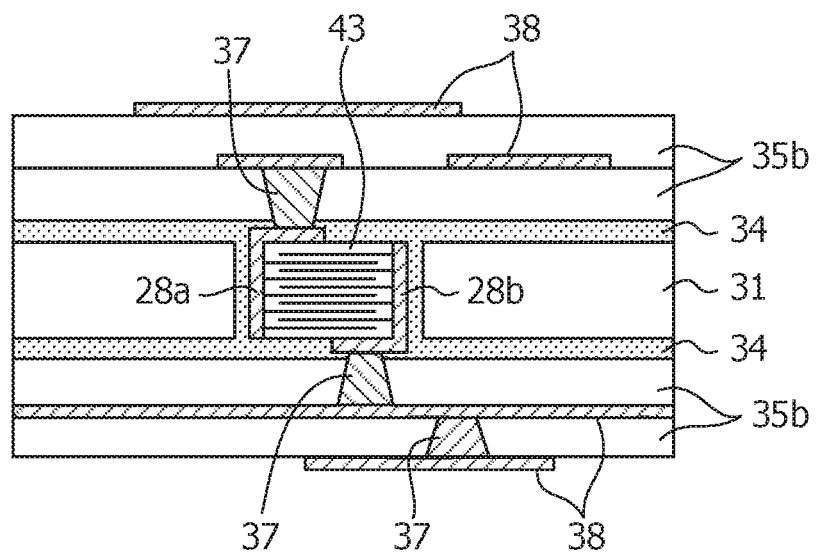
FIG. 13B is a schematic sectional view illustrating a component-embedded substrate in which the electronic component according to modification 3 is used.

FIG. 13A is a schematic diagram illustrating an electronic component according to modification 3 of the embodiment and FIG. 13B is a schematic sectional view illustrating a component-embedded substrate in which the electronic component according to modification 3 is used. Elements in FIGS. 13A and 13B that are the same as the elements in FIGS. 2 and 8 are provided with reference characters that are the same as the reference characters in FIGS. 2 and 8.

In the electronic component 43 illustrated in FIG. 13A as well, the side surfaces of the component body 21 are the electrode joint surfaces and metal plate electrodes 28a, 28b in shape of a letter L are connected to the electrode joint surfaces through the baked electrodes 22.

Sizes of the metal plate electrodes 28a, 28b are set so as to exceed the sizes of the electrode joint surfaces of the component body 21. A part of the metal plate electrode 28a that further extends from a bent part thereof is placed on top of the component body 21 and a part of the metal plate electrode 28b that further extends from a bent part thereof is placed under bottom of the component body 21.

As illustrated in FIG. 13B, the electronic component 43 is placed in a hole provided in the core substrate 31. The metal plate electrode 28a is connected to the via 37 formed on the top side of the core substrate 31 and the metal plate electrodes 28b is connected to the vias 37 formed on the bottom side of the core substrate 31.

(Modification 4)

Figure 14A:
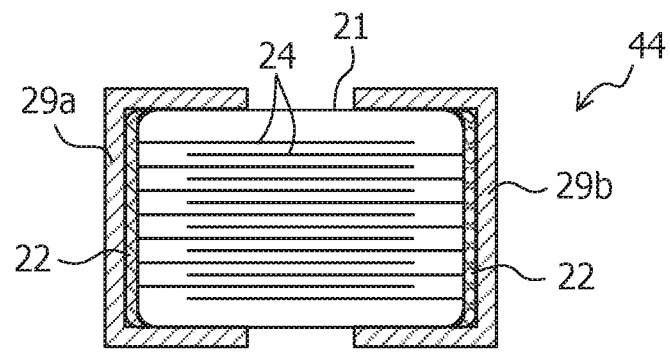
FIG. 14A is a schematic diagram illustrating an electronic component according to modification 4.
Figure 14B:
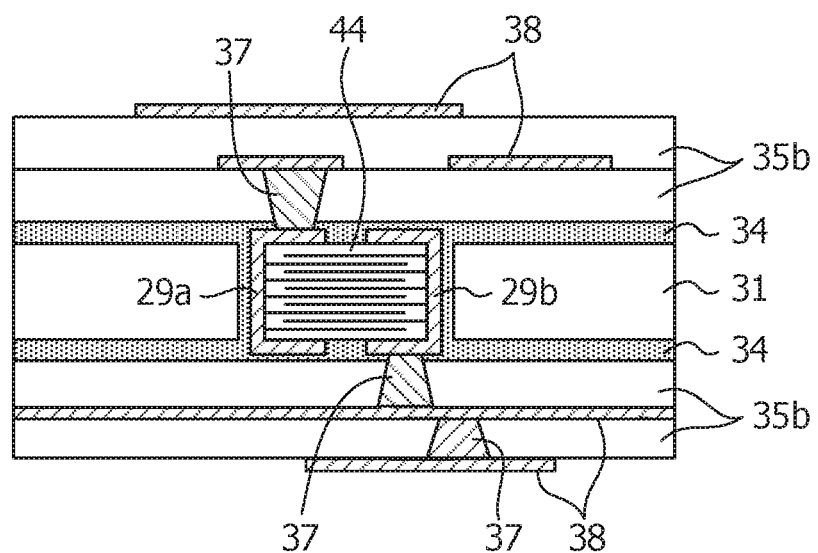
FIG. 14B is a schematic sectional view illustrating a component-embedded substrate in which the electronic component according to modification 4 is used.

FIG. 14A is a schematic diagram illustrating an electronic component according to modification 4 of the embodiment and FIG. 14B is a schematic sectional view illustrating a component-embedded substrate in which the electronic component according to modification 4 is used. Elements in FIGS. 14A and 14B that are the same as the elements in FIGS. 2 and 8 are provided with reference characters that are the same as the reference characters in FIGS. 2 and 8.

In the electronic component 44 illustrated in FIG. 14A as well, the side surfaces of the component body 21 are the electrode joint surfaces and metal plate electrodes 29a, 29b are connected to the electrode joint surfaces through the baked electrodes 22.

In both of the metal plate electrodes 29a, 29b, one end part is placed on top of the component body 21 and the other end part is placed under bottom of the component body 21. Sizes of the metal plate electrodes 29a, 29b are set so as to exceed the sizes of the electrode joint surfaces of the component body 21.

As illustrated in FIG. 14B, the electronic component 44 is placed in a hole provided in the core substrate 31. In FIG. 14B, the metal plate electrode 29a is connected to the via 37 formed on the top side of the core substrate 31 and the metal plate electrode 29b is connected to the vias 37 formed on the bottom side of the core substrate 31. Both of the metal plate electrodes 29a, 29b may be connected to either of the via 37 on the top side of the core substrate 31 and the vias 37 on the bottom side of the core substrate 31.

(Electronic Equipment)

Figure 15:
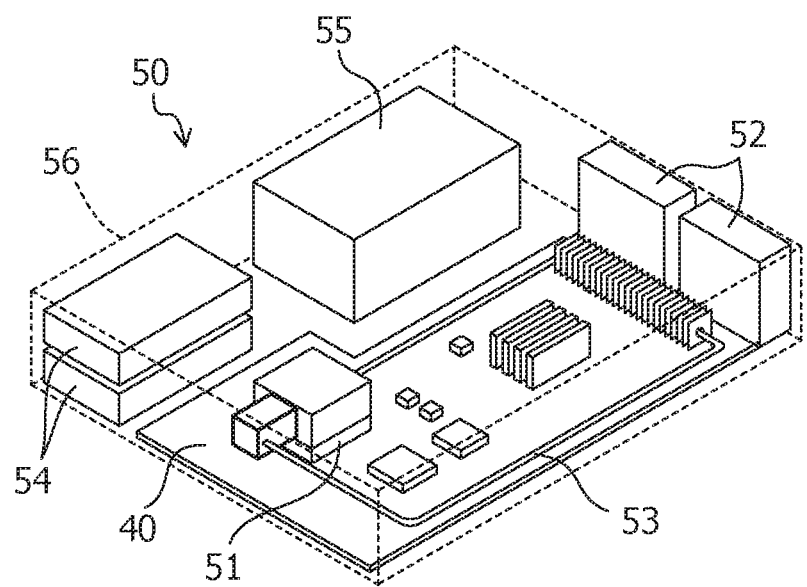
FIG. 15 is a perspective view illustrating an example of electronic equipment that includes the component-embedded substrate.

FIG. 15 is a perspective view illustrating an example of electronic equipment that includes the component-embedded substrate 40 (see FIG. 8) described for the embodiment. Though an example in which the electronic equipment is a computer will be described herein, the disclosed technique may be applied to electronic equipment other than computer, as a matter of course.

The computer 50 includes the component-embedded substrate 40 on which a CPU 51 is mounted, fans (blowers) 52, a heat pipe 53, hard disk drives (storage devices) 54, and a power unit 55. The component-embedded substrate 40, the fans 52, the heat pipe 53, the hard disk drives 54, and the power unit 55 are housed in a chassis 56.

The electronic equipment (computer 50) according to the embodiment is equipped with the component-embedded substrate 40 having structures described above, therefore attains high component packaging density, and facilitates miniaturization of and performance improvement in the electronic equipment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A component-embedded substrate comprising:
   a core substrate;
   an electronic component that is placed in a hole formed in the core substrate, the electronic component including
      a top metal plate electrode directly coupled to an upper surface of the electronic component, and
      a bottom metal plate electrode directly coupled to a lower surface of the electronic component;
   a first insulating layer formed on an upper surface of the core substrate;
   a first wiring layer formed on the first insulating layer;
   a first via formed in the first insulating layer that couples the first wiring layer and the top metal plate electrode;
   a second insulating layer formed on a lower surface of the core substrate;
   a second wiring layer formed on the second insulating layer; and
   a second via formed in the second insulating layer that couples the second wiring layer and the bottom metal plate electrode,
   wherein the top metal plate electrode exceeds the upper surface of the electronic component in size and edge parts of the top metal plate electrode protrude laterally from the electronic component, and a length and a width of the top metal plate electrode as seen looking from above are at least 1.5 times more than a length and a width of the electronic component as seen looking from above.

2. The component-embedded substrate according to claim 1, wherein a recessed part is formed in a part of the top metal plate electrode that faces the electronic component.

* * * * *